(12) United States Patent
Delgado et al.

(10) Patent No.: US 8,487,416 B2
(45) Date of Patent: Jul. 16, 2013

(54) COAXIAL POWER MODULE

(75) Inventors: Eladio Clemente Delgado, Burnt Hills, NY (US); Arun Virupaksha Gowda, Rexford, NY (US); Antonio Caiafa, Albany, NY (US); Brian Lynn Rowden, Ballston Lake, NY (US); Ljubisa Dragoljub Stevanovic, Clifton Park, NY (US); Richard Alfred Beaupre, Pittsfield, MA (US)

(73) Assignee: General Electric Company, Niskayuna, NY (US)

( * ) Notice: Subject to any disclaimer, the term of this patent is extended or adjusted under 35 U.S.C. 154(b) by 64 days.

(21) Appl. No.: 13/247,216

(22) Filed: Sep. 28, 2011

(65) Prior Publication Data

US 2013/0075878 A1  Mar. 28, 2013

(51) Int. Cl.
*H01L 23/552* (2006.01)
*H01L 23/34* (2006.01)
*H01L 23/04* (2006.01)
*H01L 23/12* (2006.01)
*H05K 7/20* (2006.01)
*H05K 9/00* (2006.01)

(52) U.S. Cl.
USPC ........... 257/659; 257/714; 257/731; 257/723; 257/724; 257/730; 361/689; 361/816; 361/818

(58) Field of Classification Search
None
See application file for complete search history.

(56) References Cited

U.S. PATENT DOCUMENTS

| 7,019,975 | B2 | 3/2006 | Nagatomo et al. |
| 7,081,671 | B2* | 7/2006 | Fukada et al. ................. 257/714 |
| 7,327,024 | B2 | 2/2008 | Stevanovic et al. |
| 7,719,092 | B2 | 5/2010 | Takubo |
| 2005/0052844 | A1* | 3/2005 | McCollum et al. ........... 361/689 |
| 2010/0230800 | A1 | 9/2010 | Beaupre et al. |
| 2010/0302734 | A1 | 12/2010 | Beaupre et al. |
| 2011/0101515 | A1 | 5/2011 | Beaupre et al. |

FOREIGN PATENT DOCUMENTS

| TW | 224375 B | 11/2004 |
| WO | 2011004081 A1 | 1/2011 |

OTHER PUBLICATIONS

Müsing et al., "Optimization of the Current Distribution in Press-Pack High Power IGBT Modules", The 2010 International Power Electronics Conference, pp. 1139, 2010.
TW224375 English Abstract.

* cited by examiner

*Primary Examiner* — Julio J Maldonado
*Assistant Examiner* — Harpreet Singh
(74) *Attorney, Agent, or Firm* — Penny A. Clarke

(57) ABSTRACT

A power module includes at least one semiconductor die holding structure. Each die holding structure has a substantially cylindrical outer profile and a central axis. Each die holding structure is disposed within a common cylindrical EMI shield. A plurality of semiconductor devices are mounted to each die holding structure to form a substantially symmetric die mounting pattern respect to the central axis of the die holding structure.

18 Claims, 3 Drawing Sheets

COAXIAL POWER MODULE

BACKGROUND

The subject matter of this disclosure relates generally to high speed semiconductor switches, and more particularly a coaxial power module that reduces electromagnetic interference (EMI) caused by high speed semiconductor switching.

More high power wide bandgap semiconductors, such as the silicon carbide (SiC) metal oxide semiconductor field-effect transistor (MOSFET) are becoming commercially available to the power conversion industry. These devices have high switching speeds and high temperature capabilities making them ideal for usage in high frequency and high-end applications such as military and avionics. Such applications are very sensitive to radiated and conducted electrical noise. Since these new semiconductors are switched with such high speeds, the interconnections and the packaging implementations of these functional blocks could be a source for both radiated and conducted electrical energy that can disrupt sensitive control and communications equipment.

Commercial power semiconductor modules historically have been designed to replicate an industry standard package so as to be able to replace existing field-installed devices. The foregoing approach is no longer a viable solution with the onset of new faster switching and high temperature technology. Existing industry standard packages have inherent geometries that are not conducive to implementing tight power interconnection. Many approaches have been implemented in attempts to reduce inductance using local planar interconnecting bus work within a module. None of these approaches have carried the concept down to the die level interconnections. Recent attempts at reducing inductance within a module have resulted in large conduction loops formed by the wire-bonds and associated routing strategies. Further, modules have been attached to DC bus bars using rectangular power contacts separated by large spaces and having to be bolted on to the bus bars themselves, creating additional interconnection inductances, and thus negate whatever gains are made by internal planar interconnections inside the power module. Modules bolted to bus bars disadvantageously take up large spaces making it difficult to design very tightly connected high-density converter/inverter modules for high-end applications such as avionics or defense related designs.

In view of the foregoing, there is a need for a technique to reduce EMI caused by high power, high speed semiconductor switches to a level that will not cause interference with sensitive control and communications equipment that either employs high power, high speed semiconductor switches or that is in the immediate vicinity of such high power, high speed semiconductor switches. The technique would be particularly advantageous if it could be applied to provide a structure having a cylindrical geometry that is conducive to the mounting of power semiconductor modules, for example, in motor rotor or stator or missile cases.

BRIEF DESCRIPTION

An exemplary power module embodiment comprises:
a cylindrical EMI shield;
at least one semiconductor die holding structure comprising a substantially cylindrical outer profile and a central axis, wherein the die holding structure is disposed within the cylindrical EMI shield; and
a plurality of semiconductor devices mounted to each die holding structure to form a substantially symmetric die mounting pattern with respect to the central axis of the die holding structure.

According to another embodiment, a power module comprises:
a cylindrical EMI shield;
at least one circumferential wrapped semiconductor die holding structure comprising a substantially cylindrical outer profile and a central axis, wherein the die holding structure is disposed within the cylindrical EMI shield; and
a plurality of semiconductor devices mounted to each die holding structure to form a substantially symmetric die mounting pattern with respect to the central axis of the die holding structure.

According to yet another embodiment, a power module comprises:
a cylindrical EMI shield;
at least one multi-stack radial semiconductor die holding structure comprising a substantially cylindrical outer profile and a central axis, wherein the die holding structure is disposed within the cylindrical EMI shield; and
a plurality of semiconductor devices mounted to each die holding structure to form a substantially symmetric die mounting pattern with respect to the central axis of the die holding structure.

DRAWINGS

The foregoing and other features, aspects and advantages of the invention are apparent from the following detailed description taken in conjunction with the accompanying drawings in which like characters represent like parts throughout the drawings, wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION

Figure 1:
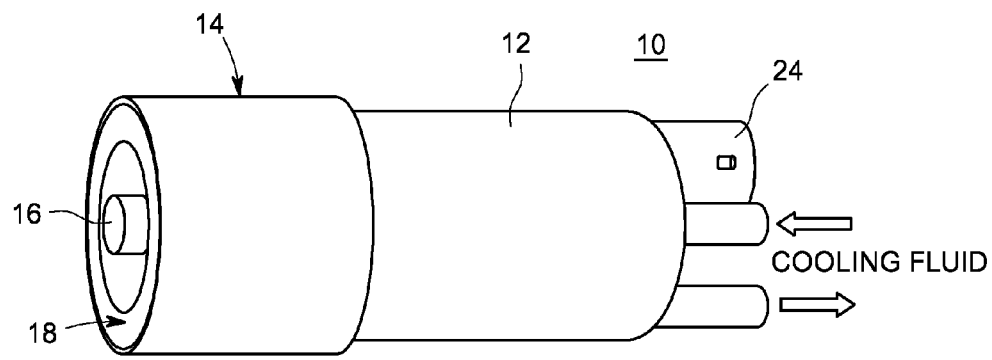
FIG. 1 is a perspective diagram illustrating a coaxial power module according to one embodiment.

FIG. 1 is a perspective diagram illustrating a coaxial power module 10 according to one embodiment. According to particular embodiments, power module 10 comprises a cylindrical main body 12 that surrounds a circumferential POL assembly or a multi-stack radial wire bond assembly, both described in more detail herein. The cylindrical main body 12 comprises a metal housing that forms a Faraday shield/cage surrounding the POL or wire bond assemblies to capture EMI and prevent airborne electrical noise that may otherwise be caused by the power module 10.

Coaxial power module 10 further comprises a cylindrical power connector 14 coupled to one end of the cylindrical main body 12. According to one embodiment, the cylindrical power connector 14 is a coaxial type multi-pole power connector that comprises a center/inner conductor 16 and a cylindrical outer conductor 18 surrounding the inner conductor 16. According to some embodiments, the inner conductor 16 may be configured as a drain or collector conductor, while the cylindrical outer conductor may be configured as a source or emitter conductor. Although cylindrical power connector 14 depicts a single switch structure, other embodiments can be easily implemented to provide a multi-switch structure.

Figure 2:
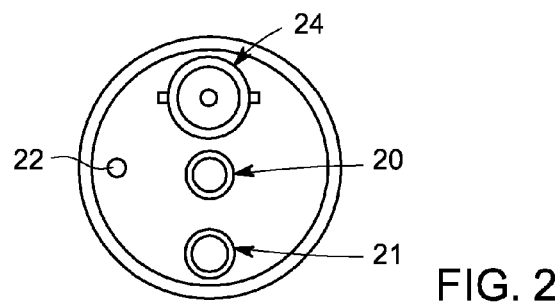
FIG. 2 is an end view illustrating a BNC gate connector and cooling fluid piping coupled at one end of the coaxial power module depicted in FIG. 1.

FIG. 2 is an end view illustrating a BNC gate connector 24 and cooling fluid conduit fluid inlet and outlet ports 20, 21 at one end of the coaxial power module 10 depicted in FIG. 1. BNC as used herein is an abbreviation for bayonet Neil-Concelman type connector that is a small device for connecting coaxial type cables. According to one embodiment, the end of the cylindrical main body 12 opposite the end coupled to the cylindrical power connector 14 comprises fluidic interface connections 20, 21 for receiving and expelling a suitable cooling fluid, a shield connection 22, and a BNC type gate connector 24. In summary explanation, a coaxial power module 10 comprises a cylindrical geometry having power interconnections implemented with multi-pole cylindrical connectors 14 placed on one end of the cylinder 12 and cooling fluid ports 20, 21 and a gate driver control signal connector 24 placed on the opposite end of the main body cylinder 12.

All power interconnections are preferably implemented such that conduction path loops are minimized and all current paths have conductor pairs, whose currents oppose each other, thus causing flux cancellation in the power interconnections within the module 10 and its associated power interface(s). Die interconnections within the module 10 are also preferably implemented to reduce the current loops and to have the same flux cancellation strategy to reduce the overall inductance of the module 10.

Figure 3:
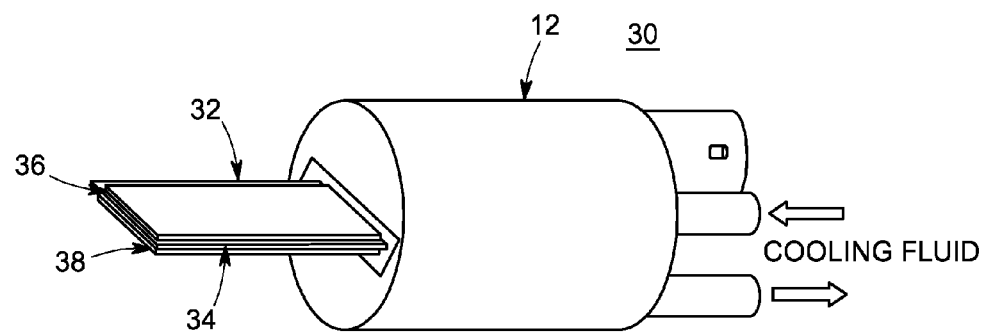
FIG. 3 is a perspective diagram illustrating a coaxial power module according to another embodiment.

FIG. 3 is a perspective diagram illustrating a coaxial power module 30 according to another embodiment. Coaxial power module 30 is identical to coaxial power module 10 except coaxial power module 30 comprises a multilayer blade type power connector 32 having very thin high voltage insulation 34 between power contacts 36, 38 that may be, for example, a source or emitter contact 36, and a drain or collector contact 38. Although multilayer blade type power connector 32 depicts a single switch structure, other embodiments can be implemented using the principles described herein to provide a multi-switch structure.

Figure 4:
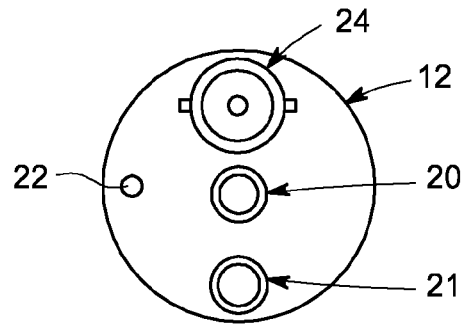
FIG. 4 is an end view illustrating a BNC gate connector and cooling fluid piping coupled at one end of the coaxial power module depicted in FIG. 3.

FIG. 4 is an end view illustrating a shield connection 22, a BNC type gate connector 24 and cooling fluid conduit inlet and outlet ports 20, 21 placed at one end of the cylindrical main body shield 12 depicted in FIG. 3.

According to particular embodiments, the coaxial power modules 10, 30 further each comprise a die holding structure that may be implemented using a multi-stack radial structure or a circumferential wrapped structure. The multi-stack radial structure and circumferential wrapped structure may be implemented using either wire bonding or POL technology described in further detail herein.

Figure 5:
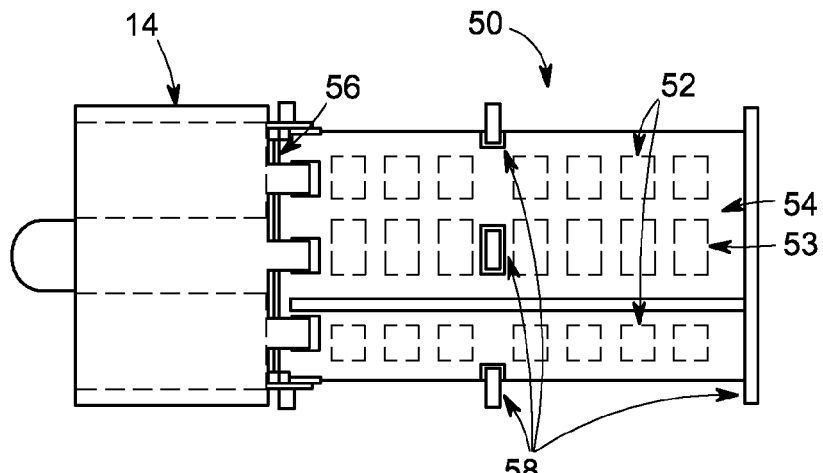
FIG. 5 illustrates a circumferential power overlay (POL) assembly according to one embodiment, and that is suitable for use with the coaxial power modules depicted in FIGS. 1 and 3.

FIG. 5 illustrates a circumferential power overlay (POL) assembly 50 according to one embodiment, and that is suitable for use with coaxial power modules 10, 30. POL assembly 50 comprises a plurality of semiconductor dies disposed circumferentially inside POL 50. The semiconductor dies may comprise, for example, diode dies 52 and/or MOSFET/insulated gate bipolar transistor (IGBT) dies 53. POL assembly 50 further comprises an outer layer of copper conductor 54 that ultimately makes contact with the outer cylindrical conductor 18 of a corresponding cylindrical power connector 18 to form an external emitter/source connector. Copper conductors 56 are configured to provide an electrical pathway between the collector/drain portion of each semiconductor die 52, 53 and the inner conductor 16 of a corresponding cylindrical power connector 18 to form an external collector/drain connector. Other embodiments may just as easily employ power connectors having geometries other than cylindrical, such as the blade type power connector 32 depicted in FIG. 3, depending upon the desired application. Ceramic spacers 58 are employed at various locations to provide the requisite electrical isolation between the outer layer of copper conductor 54 and a corresponding cylindrical Faraday shield 12 in contact with the spacers 58 to complete the assembly, such as depicted in FIGS. 1 and 3. The spacers 58 allow a metal/Faraday shield 12 to slide over the entire module, thus creating the Faraday shield that encloses EMI, and thus blocking airborne electrical noise that may otherwise enter or exit the POL assembly 50. The shield 12 preferably comprises a location to mount a screw or similar hardware allowing attachment of a wire and to capacitively or hard wire decouple the shield 12 to a reference power connection so as to provide a low conduction path for high frequencies back to their place of origin.

The cylindrical module structure advantageously provides the ability to cluster this type of geometry and pack it very tightly on a bus bar; whereas known module structures are interconnected to their bus bars on a face bolt-on approach taking up a large area on the bus bars, and making it necessary to access both sides for replacement purposes without first disassembling the power converter.

Figure 6:
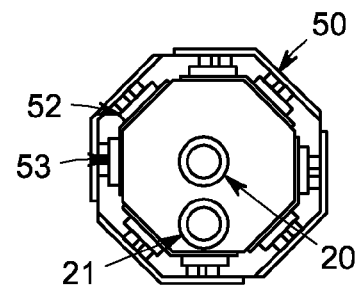
FIG. 6 is a cross-sectional view illustrating cooling fluid inlet and outlet pipes coupled to the circumferential POL assembly depicted in FIG. 5.

FIG. 6 is a cross-sectional view illustrating ceramic cooling fluid inlet and outlet pipes 20, 21 coupled to the circumferential POL assembly 50 depicted in FIG. 5. According to one aspect, a cooling fluid enters the innermost portion of fluid pipe 20 and exits through the outermost portion of fluid pipe 21 subsequent to passing through one or more heat exchangers in close proximity to the POL assembly 50 to provide cooling of the semiconductor dies 52, 53.

Figure 7:
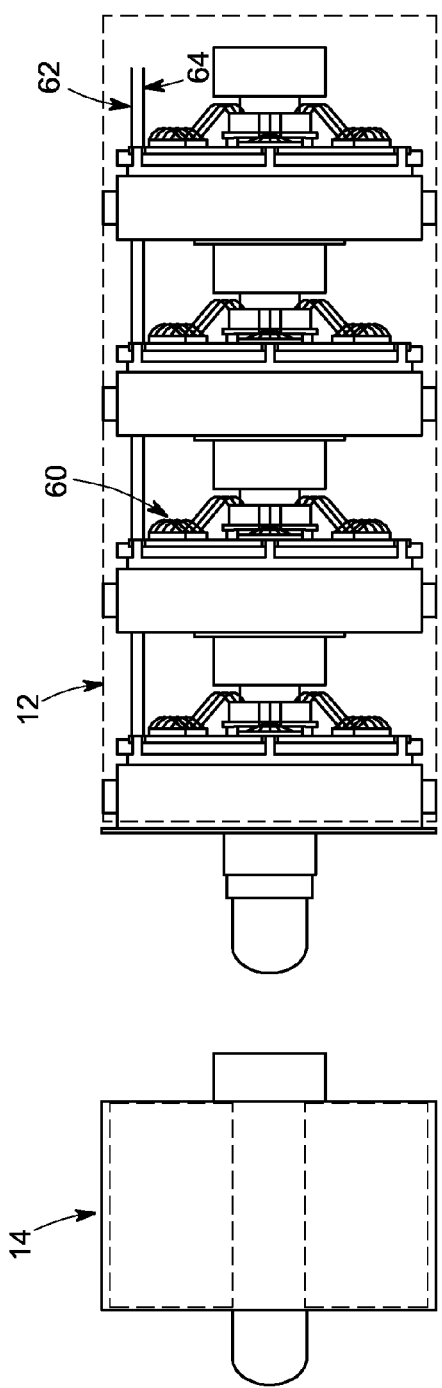
FIG. 7 illustrates a radial wire-bond sub-assembly stack according to one embodiment, and that is suitable for use with the coaxial power modules depicted in FIGS. 1 and 3.

FIG. 7 illustrates a radial wire-bond sub-assembly stack 60 disposed within a cylindrical Faraday shield 12 according to one embodiment, and that is suitable for use with coaxial power modules 10, 30. The wire-bond sub-assembly stack 60 comprises a semiconductor device gate wire 62 and gate return wire 64 that are connected to a BNC connector 24 placed on one end of the cylindrical Faraday shield 12. The radial wire-bond sub-assembly stack 60 is attached to a cylindrical multi-pole connector 14 at an end of the cylindrical Faraday shield 12 opposite the end of the Faraday shield 12 with the BNC connector 24.

Figure 8:
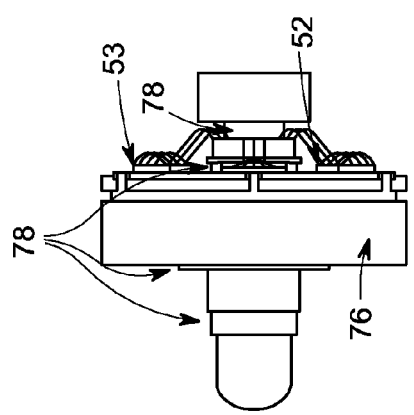
FIG. 8 illustrates a single radial wire-bond sub-assembly for the radial wire-bond sub-assembly stack depicted in FIG. 7.

FIG. 8 illustrates a single radial wire-bond sub-assembly portion 70 of the radial wire-bond sub-assembly stack 60 depicted in FIG. 7. According to one embodiment, sub-assembly portion 70 comprises at least one MOSFET/IGBT die 53 and at least one diode die 52. According to one embodiment, each sub-assembly portion 70 of the radial wire-bond sub-assembly stack 60 further comprises an integral heat exchanger 76 that functions to cool the corresponding dies 52, 53. Various insulators 78 are configured to provide the requisite insulation between the heat exchanger 76, wire-bonds 79, and power terminals.

Figure 9:
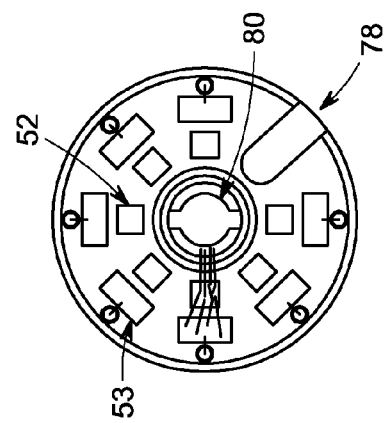
FIG. 9 is an end view is the sub-assembly depicted in FIG. 8.

FIG. 9 is an end view of the coaxial power module depicted in FIG. 7. A cooling pipe slot 78 in the cylindrical Faraday shield 12 depicted in FIG. 7 accommodates cooling fluid inlet and outlet piping/conduit for the integral heat exchanger(s) 76 also depicted in FIGS. 7 and 8. Another opening 80 in the cylindrical Faraday shield 12 accommodates mounting of a BNC connector such as the BNC connector 24 depicted in FIGS. 1 and 2.

In summary explanation, cylindrical power module embodiments implement power interconnections that form coaxial or planar structures down to the die interconnecting level, providing extremely narrow conduction loops and flux cancellation techniques. Integral heat exchanger manifolds cool the dies and can be decoupled via capacitors to provide a path for conducted electrical noise back to the source. An overall shield prevents airborne electrical noise by providing a Faraday cage surrounding the cylindrical module. The Faraday cage can also be decoupled using hardwire or capacitor interconnections to a ground system. The cylindrical power module power connectors are cylindrical or planar blade types which provide for extremely small conduction loops to the main bus bar connections. This type of power interconnection advantageously allows for very small footprints and enables very dense packing of the power module(s).

The embodiments described herein advantageously enable new device technologies to take advantage of faster switching speeds without presenting negative impacts on the overall electrical performance of the system. These embodiments reduce power module inductance and interconnecting resistance voltage overshoots to avoid ringing, while voltage drops due to interconnection impedances are reduced thus reducing power loss. These embodiments may also incorporate many small SiC devices to produce a large current carrying module making it possible to commercially offer high current all SiC device modules, a feature that is difficult at best using present module technologies due to difficulties with interconnecting a large number of small SiC devices using wire-bonding with present module geometries. Further, the embodied cylindrical structures described herein advantageously provide a geometry that is much more conducive to the mounting of power semiconductor modules without limitation, in motor rotor or stator or missile cases.

In further summary explanation, a coaxial power module implemented according to the principles described herein provides a packaging approach focused on reducing electromagnetic interference by reducing interconnection parasitic, implementing magnetic flux cancellation, and by containing EMI within a Faraday shield. The embodied coaxial power modules can be implemented having current ratings from low current to hundreds of amps and a voltage range up to kilovolts. A preferred method of cooling is liquid cooling for particular embodiments due to large power handling capabilities. According to particular embodiments, a coaxial power module is implemented with quick disconnects allowing for quick and easy replacement. Further, embodiments can advantageously be employed, without limitation, as an integral part of a power conversion system such as a single power switch, a phase configuration having multiple power semiconductor switches, and/or a multiple phase configuration having multiple power semiconductor switches.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A power module comprising:
a cylindrical electromagnetic interference (EMI) shield;
one or more semiconductor die holding structures, each die holding structure comprising a substantially cylindrical outer profile and a central axis, wherein each die holding structure is disposed within the cylindrical EMI shield; and
a plurality of semiconductor devices mounted to each die holding structure to form a substantially symmetric die mounting pattern with respect to the central axis of the die holding structure.

2. The power module according to claim 1, wherein the plurality of semiconductor devices is selected from one or more diodes, one or more metal oxide semiconductor field-effect transistors (MOSFETs), one or more insulated gate bipolar transistors (IGBTs), and combinations thereof.

3. The power module according to claim 1, further comprising:
a multi-terminal power connector disposed at a first end of the cylindrical EMI shield;
a single terminal connector disposed at a second end of the cylindrical EMI shield opposite the first end; and
cooling fluid inlet and outlet ports disposed at the second end of the cylindrical EMI shield.

4. The power module according to claim 3, wherein the multi-terminal power connector comprises a cylindrical geometry.

5. The power module according to claim 3, wherein the multi-terminal power connector comprises a multi-layer blade geometry.

6. The power module according to claim 3, wherein the multi-terminal power connector comprises a drain or collector terminal and a source or emitter terminal.

7. The power module according to claim 3, wherein the single terminal connector comprises a BNC gate connector.

8. The power module according to claim 1, further comprising one or more integral heat exchangers configured to remove heat from the plurality of semiconductor devices.

9. The power module according to claim 8, further comprising a cooling fluid conduit configured to pass cooling fluid through each heat exchanger via cooling fluid inlet and outlet ports placed at one end of the cylindrical EMI shield.

10. The power module according to claim 1, wherein the semiconductor die holding structure comprises a multi-stack radial die holding structure.

11. The power module according to claim 10, wherein the multi-stack die holding structure further comprises a wire bonding structure.

12. The power module according to claim 10, wherein the multi-stack die holding structure further comprises a power overlay structure.

13. The power module according to claim 1, wherein the semiconductor die holding structure comprises a circumferential wrapped die holding structure.

14. The power module according to claim 13, wherein the circumferential wrapped die holding structure comprises a wire bonding structure.

15. The power module according to claim 13, wherein the circumferential wrapped die holding structure comprises a power overlay structure.

16. The power module according to claim 1, further comprising an EMI shield decoupling apparatus configured to decouple the EMI shield to a reference power connection and provide a low conduction path for high frequency signals there from.

17. A power module comprising:
- a cylindrical electromagnetic interference (EMI) shield;
- one or more multi-stack radial semiconductor die holding structures, each die holding structure comprising a substantially cylindrical outer profile and a central axis, wherein each die holding structure is disposed within the cylindrical EMI shield; and
- a plurality of semiconductor devices mounted to each die holding structure to form a substantially symmetric die mounting pattern with respect to the central axis of the die holding structure.

18. The power module according to claim 17, further comprising:
- a multi-terminal power connector disposed at a first end of the cylindrical EMI shield, the multi-terminal power connector comprising a geometry selected from a cylindrical geometry and a multi-layer blade geometry;
- a single terminal connector disposed at a second end of the cylindrical EMI shield opposite the first end; and
- one or more integral heat exchangers configured to remove heat from the plurality of semiconductor devices, each heat exchanger connected to one or more cooling fluid inlet and outlet ports configured to receive and transmit a cooling fluid at the second end of the cylindrical EMI shield.

* * * * *